United States Patent
Talieh et al.

(10) Patent No.: US 6,248,398 B1
(45) Date of Patent: Jun. 19, 2001

(54) COATER HAVING A CONTROLLABLE PRESSURIZED PROCESS CHAMBER FOR SEMICONDUCTOR PROCESSING

(75) Inventors: Homayoun Talieh, San Jose; Alex Lurye, Fremont, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/651,277

(22) Filed: May 22, 1996

(51) Int. Cl.$^7$ ........................................... B05D 1/00
(52) U.S. Cl. ................. 427/240; 427/294; 427/377; 427/425; 118/50; 118/52; 118/56; 118/603; 118/610; 118/319; 118/320; 118/500
(58) Field of Search .................. 118/683, 684, 118/50, 52, 56, 603, 610, 319, 320, 500, 715; 427/240, 294, 377, 425; 134/902

(56) References Cited

U.S. PATENT DOCUMENTS

| | | | |
|---|---|---|---|
| 5,108,792 | 4/1992 | Anderson et al. | 427/248.1 |
| 5,254,367 | 10/1993 | Matsumura et al. | 427/240 |
| 5,362,372 | 11/1994 | Tepman | 204/192.12 |
| 5,362,526 | 11/1994 | Wang et al. | 427/573 |
| 5,380,414 | 1/1995 | Tepman | 204/192.3 |
| 5,387,067 | 2/1995 | Grunes | 414/217 |
| 5,454,871 | 10/1995 | Liaw et al. | 118/300 |
| 5,486,975 | 1/1996 | Shamouilian et al. | 361/234 |
| 5,496,408 | * 3/1996 | Motoda et al. | 118/715 |
| 5,582,866 | * 12/1996 | White | 118/715 |
| 5,670,210 | 9/1997 | Mandal et al. | 427/240 |

FOREIGN PATENT DOCUMENTS

| | | |
|---|---|---|
| 0 540 447 A1 | 5/1993 | (EP). |
| 2 597 372 | 10/1987 | (FR). |
| 57-166033 | 10/1982 | (JP). |
| 62-221464 | 9/1987 | (JP). |
| 04035768 | 2/1992 | (JP). |

OTHER PUBLICATIONS

D.E. Bornside, C.W. Macosko and L.E. Scriven, J. Appl. Phys. 66 (11) Dec. 1, 1989, 1989 American Institute of Physics, *Department of Chemical Engineering and Materials Science,* University of Minnesota, Minneapolis, Minnesota 55455; Received Jun. 16, 1989; accepted for publication Aug. 17, 1989).

Bureau et al., "Photoresist Deposition with Nitrogen to Suppress the Dewetting Problem," IBM Technical disclosure bulletin, vol. 22, No. 5, Oct. 5, 1979, p. 1884.

* cited by examiner

Primary Examiner—Laura Edwards
(74) Attorney, Agent, or Firm—Robert J. Stern

(57) ABSTRACT

A coater having a controllable pressurized process chamber for applying photoresist to a wafer is provided. The controllable pressurized process chamber reduces the evaporation of solvent in the photoresist during a spin-on process step. Reducing premature curing of the photoresist results in improved uniform planarization of the photoresist layer. Contaminants in the photoresist are also reduced by having an environmentally controllable process chamber. A housing having a upper and lower section forms a process chamber surrounding a wafer chuck. The upper housing section includes a solvent vapor opening for introducing pressurized solvent vapor into the process chamber and the lower housing section includes an exhaust opening. The upper housing section also includes an opening for introducing photoresist onto a wafer. A control device is coupled to the exhaust opening and a vacuum device for controlling the pressure in the process chamber. A sealed recycling photoresist container and recycling apparatus is also coupled to the exhaust opening to store unused photoresist. The unused photoresist may be used in subsequent spin-on process steps, thereby reducing processing costs.

10 Claims, 5 Drawing Sheets

COATER HAVING A CONTROLLABLE PRESSURIZED PROCESS CHAMBER FOR SEMICONDUCTOR PROCESSING

BACKGROUND OF THE INVENTION

1. Field of the Invention

The present invention relates to a semiconductor manufacturing process and, in particular, to a coater for dispensing an organic and/or inorganic material on a substrate in a controllable pressurized process chamber.

2. Description of the Related Art

In manufacturing a semiconductor device, a substrate, such as a wafer, is typically coated with an inorganic and/or organic material in a process step. Often, a wafer is coated with a photoresist. The wafer is first positioned in a coater, or specifically on a wafer chuck. A motor spins the wafer chuck and wafer while the photoresist is dispensed onto the center of the wafer. The spinning imparts an angular torque onto the photoresist, which forces the photoresist out in a radial direction, ultimately covering the wafer. This semiconductor manufacturing process step is generally known as "the spin-on photoresist step". The photoresist coated wafer then may be removed from the coater and baked to form a photoresist layer on the wafer.

During the spin-on photoresist step, a solvent vapor is typically introduced into an area near the surface of the wafer in order to control the coating of the photoresist. As the photoresist moves radially from the center of the wafer, the photoresist tends to cure prematurely due to the evaporation of solvent in the photoresist. As the curing photoresist moves radially from the center of the wafer, a non-uniform surface is created. By introducing solvent vapor near the wafer during the spin-on step, this premature curing of the photoresist may be reduced. A flat plate may be positioned above the wafer forming a very small gap to trap the solvent fumes from the photoresist during the spinon step in order to minimize the rate at which the photoresist cures. However, the introduction of solvent vapors and a plate does not adequately solve the premature curing of photoresist and the resulting non-uniformly coated wafer surface.

Generally, the photoresist is deposited upon a preexisting varied wafer topology. The wafer may have undergone previous manufacturing process steps creating the varied wafer topology. A uniform planar photoresist region on a semiconductor device is important to offset the effects of varied wafer topology. Typically, semiconductor manufacturing process steps require a uniform planar region in order to have a uniform process. A uniform planarized photoresist surface or layer will reduce semiconductor device manufacturing defects and improve semiconductor reliability and cost.

The uniform planarization of a photoresist layer depends on many factors. One of these factors includes the pressure surrounding the formation of the photoresist layer on the wafer. The pressure surrounding the wafer substrate surface during the photoresist spin-on step affects the evaporation rate of the solvent in the photoresist and eventually the surface uniformity of the photoresist layer.

Another factor affecting photoresist planarization includes the chemical composition of the environment during the photoresist spin-on step. Ideally, a solvent vapor-rich and contaminant-free environment is desirable in the photoresist spin-on step. As discussed above, a solvent vapor-rich environment will reduce solvent evaporation from the photoresist. Also, contaminants from the surrounding air entering the coater should be eliminated. Chemical contaminants, such as n-butyl acetate fumes, from processes elsewhere in the manufacturing of a semiconductor reduce the adhesion of the photoresist to the wafer substrate and should be eliminated. Likewise, solid particles generated by operators or process equipment adjacent to the coater should not be allowed to enter the photoresist spin-on process step.

Coaters typically waste a large amount of photoresist during the photoresist spin-on step. As much as 97% of the photoresist may be spun off the surface of the wafer and eventually not directly used in forming the photoresist layer. The wasted photoresist may add significant costs to the production of a wafer containing semiconductor devices. In order to coat a wafer with photoresist, approximately $20 may be expended on only the photoresist. These costs are expected to rise as semiconductor device geometries are reduced in order to obtain faster operating speeds. Furthermore, there are added costs in properly disposing of the photoresist waste which may be considered hazardous waste.

Thus, it is desirable to provide a coater for dispensing organic and/or inorganic material, such as photoresist, onto a wafer substrate surface in a controlled environment. The controlled environment would enable forming uniformly planarized photoresist layers in a contaminant reduced environment, thereby reducing semiconductor manufacturing costs and defects while enhancing semiconductor reliability and performance. Further, it is desirable to have a coater which minimizes photoresist waste, thereby reducing costs in manufacturing semiconductor devices

SUMMARY OF THE INVENTION

In accordance with the present invention, a photoresist coater having a controllable process chamber is provided. The controllable process chamber enables the formation of a uniform planarized photoresist layer on a wafer in a predetermined pressure and chemical environment. The coater also includes a recycling apparatus for storing excess photoresist.

The photoresist coater includes a wafer chuck having a wafer chuck surface for positioning a wafer substrate to be coated with the photoresist. A spin motor is coupled to the wafer chuck and rotates the wafer chuck. A lower housing section having a first exhaust opening is coupled to the wafer chuck and an upper housing section is coupled to the lower housing section forming a process chamber surrounding the wafer chuck surface. A vacuum device is coupled to the lower housing section and creates back pressure in the process chamber through the first exhaust opening. A control device coupled to the lower housing controls the pressure in the process chamber.

According to another aspect of the present invention, the photoresist coater includes an upper housing section having a material dispensing opening and a lower housing section having an exhaust opening. The lower housing section is positionable to access the process chamber. The upper housing section also includes a cavity for containing solvent vapor and a plurality of cavity openings for introducing solvent vapor into the process chamber.

According to another aspect of the present invention, the lower housing section includes an opening for introducing nitrogen into the process chamber.

According to still another aspect of the present invention, the photoresist coater includes a photoresist recycling apparatus coupled to an exhaust tube for storing unused photoresist from the process chamber. The photoresist recycling apparatus includes a photoresist container coupled to a control device for sealing the photoresist container.

According to another aspect of the present invention, the photoresist recycling apparatus includes a collection tube having a baffle coupled to the exhaust tube. The collection tube is further coupled to a vacuum. Also, the collection tube is coupled to a reservoir for holding unused photoresist.

According to another aspect of the present invention, a process for forming a photoresist layer on a wafer substrate in a pressurized controllable process chamber is provided. The process comprises the steps of opening the process chamber and positioning the wafer substrate on a wafer chuck in the process chamber. The process chamber is then closed. The process chamber is then evacuated and the chamber value is set to a predetermined setting. The process chamber is pressurized with a solvent vapor. The photoresist is applied and the wafer chuck is spun, while nitrogen may be introduced. The chamber value is then opened.

BRIEF DESCRIPTION OF THE DRAWING

Other advantages of the invention will become apparent upon reading the following detailed description and upon reference to the drawing.

DETAILED DESCRIPTION

Figure 1:
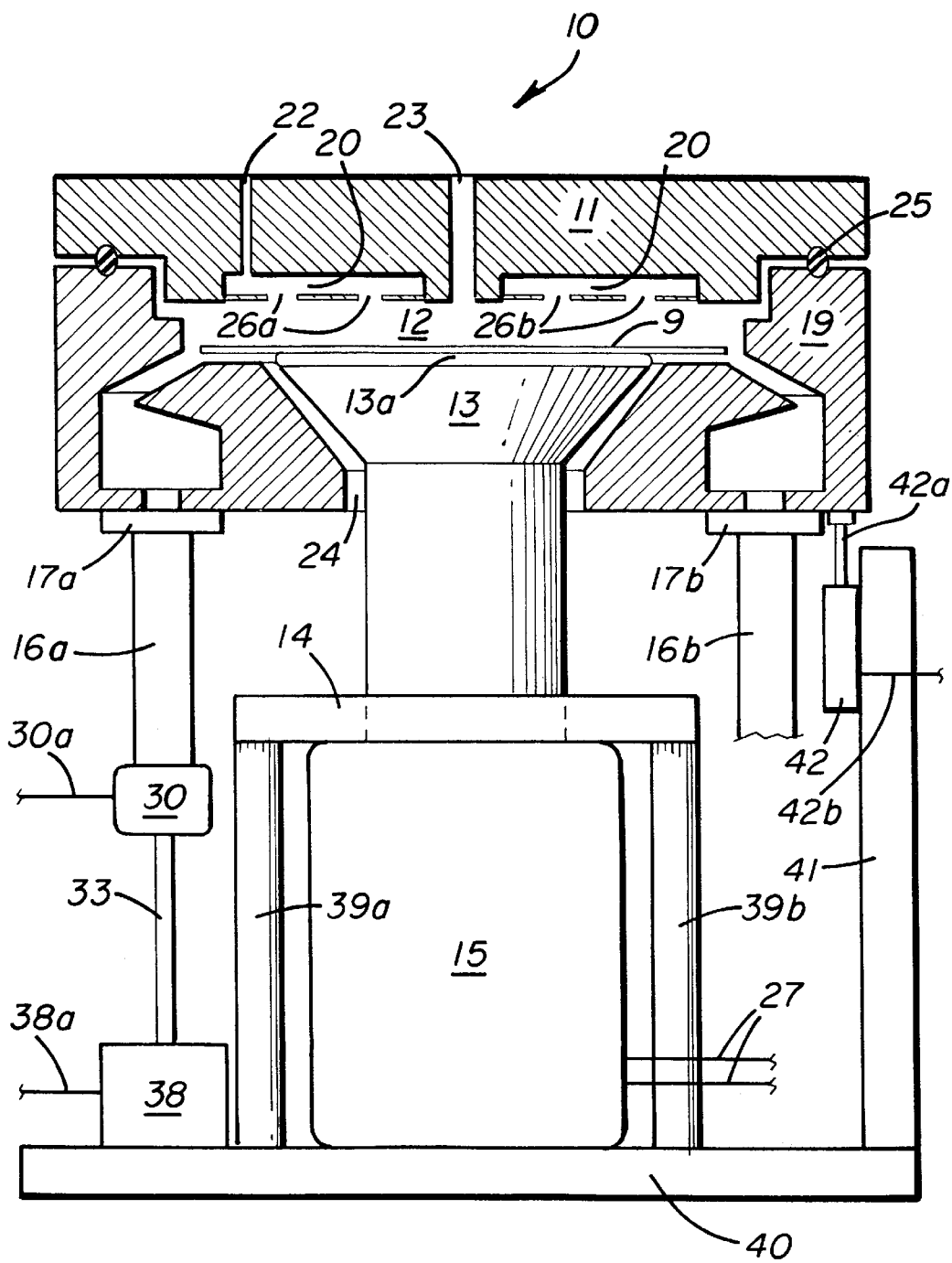
FIG. 1 illustrates a side cross sectional view of a coater having a controllable pressurized process chamber according to the present invention.

FIG. 1 illustrates a side cross sectional view of a coater 10 having a controllable pressurized process chamber 12 accordingly to the present invention. Process chamber 12 is formed by a housing having an upper section 11 and a lower section 19. Upper section 11 is attached to lower housing section 19 by representative O-ring seals 25. The sealed process chamber 12 allows for a controlled environment in applying a photoresist to a substrate 9, such as a wafer, or more specifically, a silicon wafer. Other materials may be likewise dispensed upon substrate 9, such as viscous polymers, spin-on-glass and anti-reflection coating materials. Contaminants introduced into the photoresist are reduced and photoresist planarization is enhanced by controlling the environment in process chamber 12. Two housing sections are used to form process chamber 12 rather than a single housing construction. The double housing section design allows for a user to access the process chamber 12. The manufacturability of coater 10 is also enhanced by forming process chamber 12 from two housing sections rather than constructing a single housing.

Wafer chuck 13 having wafer chuck surface 13a is positioned in process chamber 12. Wafer chuck surface 13a is used for positioning the wafer and is coupled to spin motor 15. In the preferred embodiment, a vacuum wafer chuck 13 is used. A vacuum channel internal to wafer chuck 13 and motor 15 is used to secure the substrate 9 on the wafer chuck surface 13a. A wafer chuck vacuum may be coupled to motor 15 and create negative pressure in the vacuum channel, thus securing the substrate 9 to wafer chuck surface 13a. In other embodiments, an electrostatic wafer chuck using electrostatic attraction forces may be used in securing the substrate 9. In particular, at very low pressures in process chamber 12, for example at or near 0 torr, an electrostatic wafer chuck, as known by one of ordinary skill in the art, may be required.

Figure 2:
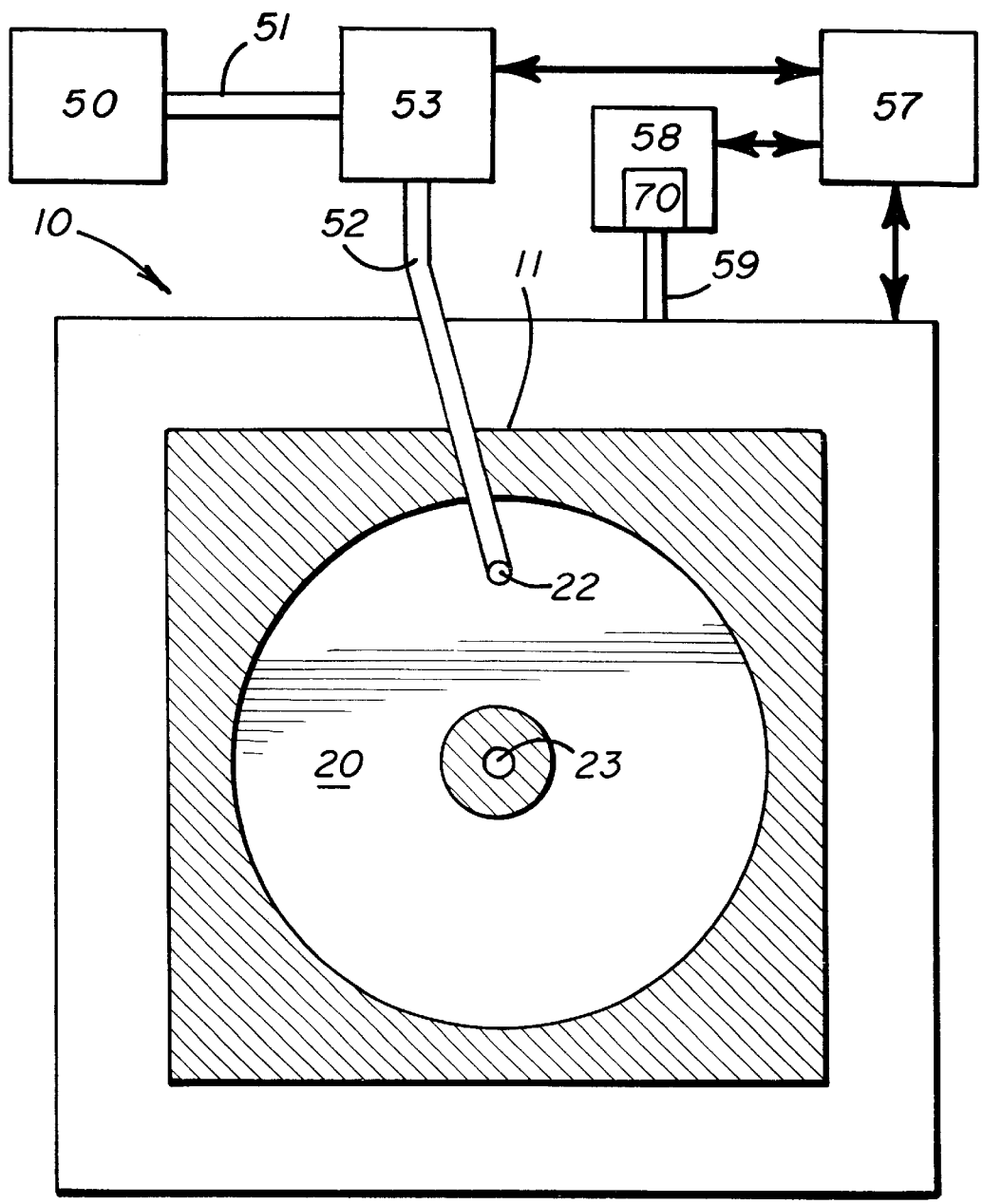
FIG. 2 illustrates a top view of a coater having a controllable pressurized process chamber according to the present invention.

Motor 15 is coupled to mount bracket 14, which is supported by posts 39a and 39b. The posts 39a and 39b are likewise coupled to base plate 40. Spin motor 15 is controlled by signals on wire leads 27. Spin motor 15 may operate from 0–10,000 revolutions per minute ("rpm"). Spin motor 15, in response to signals on wire leads 27, spins wafer chuck 13 and substrate 9 during the spin-on process step. The rpm setting will depend upon a variety of process step parameters, such as desired chamber 12 pressure and photoresist type. Spin motor 15, as well as air cylinder 42, control device 30, control device 34, pressure regulator 53, nitrogen source 58 and vacuum 38 are controlled by controller 57, as illustrated in FIG. 2. Controller 57 generates the appropriate electrical signals at predetermined times on the various wire leads to control the spin-on-process step.

Upper housing section 11 includes openings 22 and 23. Opening 23 is used for introducing an organic and/or inorganic material, or in particular a photoresist, into the process chamber 12. Typically, the photoresist is dispensed onto the center of substrate 9 as spin motor 15 spins wafer chuck 13 and the substrate 9. Likewise, opening 22 is used for introducing a solvent vapor into process chamber 12 through cavity 20 in upper housing section 11. In an embodiment, opening 22 may be coupled to a vapor delivery system 50, as understood by one of ordinary skill in the art, for generating solvent vapor at a specified pressure. As seen in FIG. 2, vapor delivery system 50 is coupled to opening 22 by way of pressure regulator 53 and hoses 51 and 52. Specifically, vapor delivery system 50 is coupled to pressure regulator 53 by hose 51. In an embodiment, vapor delivery system 50 may be a vaporizer. Pressure regulator 53 then controls the pressure of solvent vapor introduced into opening 22 through hose 52. Openings 26a–b act as a shower head in introducing solvent vapor into process chamber 12 from cavity 20. The uniform spacing of openings 26a–b and cavity 20 enable a uniform introduction of solvent vapor into process chamber 12. In an embodiment, cavity 20 is formed in the shape of a flat, thin ring, as illustrated in FIGS. 1 and 2. The solvent vapor and excess photoresist exits through exhaust mount 17a–b and exhaust tubes 16a–b.

Opening 24 in lower housing section 19 is used for introducing nitrogen into process chamber 12. In an embodiment, opening 24 is a circular opening formed between the baffle of lower housing section 19 and the bottom of substrate 9. Nitrogen is introduced through openings 24 to eliminate back side contamination or photoresist build-up on the outer edge of substrate 9. Nitrogen source 58 and nitrogen control valve 70, along with hose 59, introduce nitrogen into openings 24, as illustrated in FIG. 2. Openings 24 in conjunction with the formation of lower housing section 19 allow for nitrogen to be directed toward the edge of a substrate 9 and thereby reducing the buildup of photoresist at the outer edge of substrate 9. The formation of lower housing section 19 creates a laminar air flow at the outer edge of substrate 9 to eliminate bottom Edge-Bead-Removal ("EBR").

The pressure of process chamber 12 is controlled in order to enhance the uniform formation of a photoresist layer on substrate 9. By controlling the pressure and chemical concentration surrounding the formation of a photoresist layer on substrate 9, the evaporation of solvent in the photoresist or cure rate may be controlled. If the area surrounding the wafer is saturated with solvent vapor, solvent evaporation is reduced or eliminated. This in turn controls the uniformity or planarization of photoresist on the substrate 9. A predetermined pressure either at or above atmospheric pressure, 760 torr, or below atmospheric pressure may enhance the planarization or other photoresist layer characteristic.

The pressure of process chamber 12 is controlled by controlling the solvent vapor pressure entering opening 22 and exiting exhaust tube 16a. The pressure and concentration of solvent vapor entering opening 22 depends upon vapor delivery system 50 and pressure regulator 53 predetermined settings. The exhaust exiting exhaust tube 16a is controlled by control device 30. For convenience, a single control device 30 and tube 33 is described and illustrated in FIG. 1. One of ordinary skill in the art would realize a similar construction could be used in conjunction with exhaust tube 16b. Control device 30 is connected to wire lead 30a. In an embodiment, wire lead 30a is coupled to controller 57. Control device 30, in response to a signal on wire lead 30a, adjusts the amount of exhaust exiting through exhaust tube 16a and eventually through flexible tube 33 to vacuum 38. The amount of back pressure created by vacuum 38 is likewise controlled by signals on wire lead 38a. In an embodiment, control device 30 may be a chamber valve which may be set to a predetermined angle in response to a signal on wire lead 30a. Thus, the amount of back pressure in exhaust tube 16a, is controlled by generating the appropriate predetermined signals on wire leads 30a and 38a to control device 30 and vacuum 38, respectively. Pressure is increased in process chamber 12 by closing the chamber valve in control device 30 and increasing solvent vapor pressure from a bubbler 50 into process chamber 12. Specifically, vapor pressure is increased by pressure regulator 53. Pressure is decreased in process chamber 12 by opening the chamber valve in control device 30 and/or increasing back pressure from vacuum 38. Pressure in process chamber 12 may range from approximately 0–1000 torr. Thus, the predetermined pressure in process chamber 12, results from the initial solvent vapor pressure introduced through opening 22 and the predetermined setting of control device 30 and vacuum 38. The chemical composition from a bubbler 50 also controls the composition of the solvent vapor in process chamber 12. Thus, pressure and chemical composition is controllable in process chamber 12 during the coating process step.

Accessing process chamber 12 for positioning substrate 9 and removing a photoresist coated substrate 9 is accomplished by positioning piston 42a in air cylinder 42. Air cylinder 42 is coupled to bracket 41 which is attached to base plate 40. As piston 42a is positioned in an upward or downward position, lower housing section 19 is likewise positioned allowing access to process chamber 12. This structure allows for robotic removal of substrate 9. Air cylinder 42 is controlled in response to signals on wire lead 42b. In an embodiment, wire lead 42b is coupled to controller 57. A likewise air cylinder and bracket may be positioned on the other side of coater 10.

FIG. 2 illustrates a top view of coater 10 having a controllable process chamber according to the present invention. As in FIG. 1, opening 23 is used for introducing a photoresist into process chamber 12 and eventually onto substrate 9. A solvent vapor delivery system 50 may be connected to opening 22 for introducing a solvent vapor into cavity 20 and ultimately through openings 26a–b to process chamber 12. Typically, the vapor delivery system 50 and the pressure regulator 53 can create vapor pressure from approximately 530 to 1000 torr. FIG. 2 illustrates controller 57 coupled to pressure regulator 53, nitrogen source 58 and coater 10 by wire leads.

Figure 3:
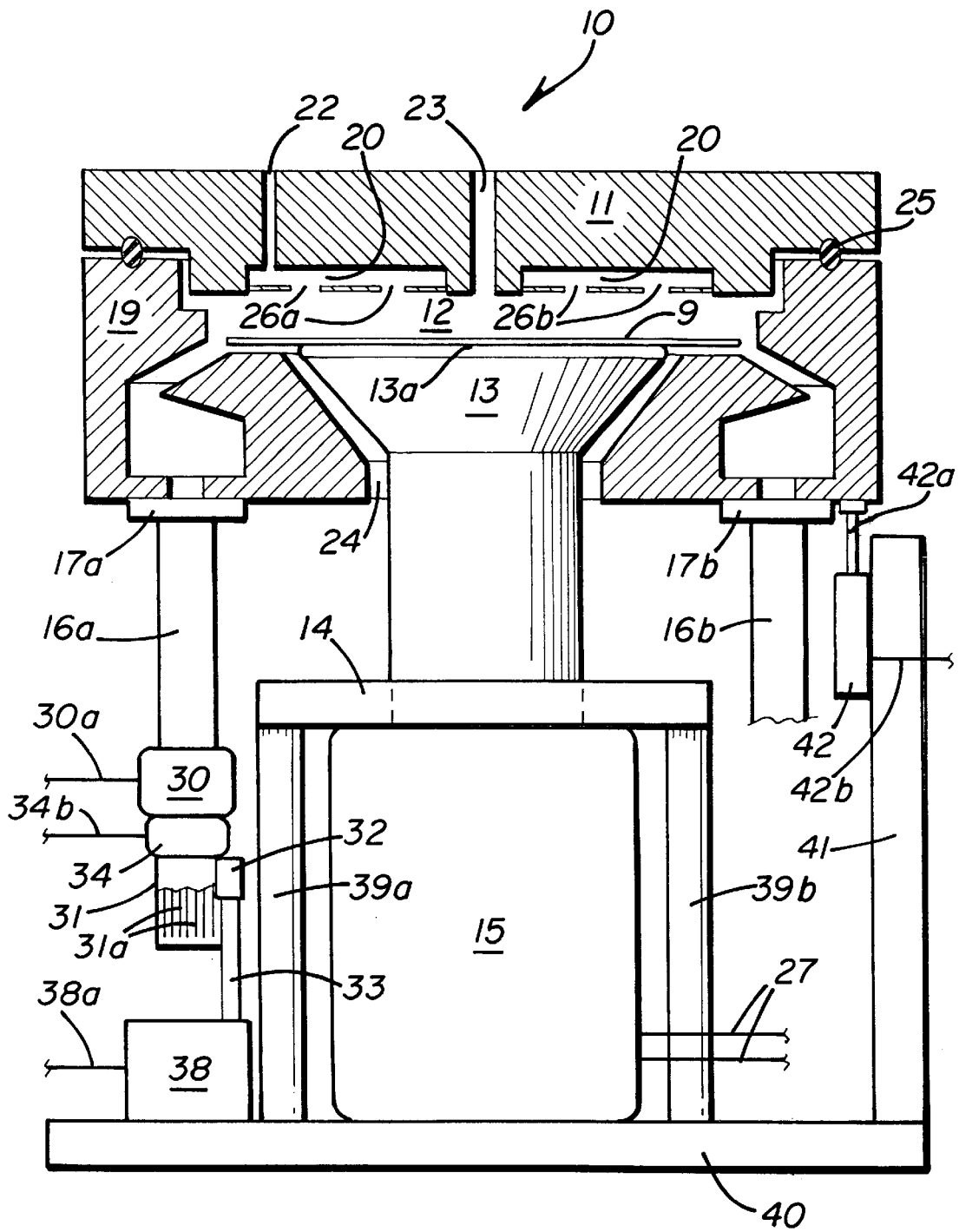
FIG. 3 illustrates a coater having a controllable pressurized process chamber and a photoresist recycling container according to the present invention.

FIG. 3 illustrates another embodiment of coater 10 according to the present invention. FIG. 2 illustrates similar components with like reference numerals as illustrated in FIG. 1. In addition, FIG. 3 illustrates a coater 10 embodiment used for storing photoresist which was not directly used in forming a photoresist layer on substrate 9. FIG. 3 illustrates an embodiment in which a single recycling container 31 is coupled to exhaust tube 16a. For convenience, a single recycling container is described and illustrated. One of ordinary skill in the art would understand that a a similar recycling container could be attached to exhaust tube 16b. Unused photoresist exits process chamber 12 through exhaust tube 16a and control device 30 and is stored in recycle container 31. Photoresist in container 31 is represented by reference number 31a. A control device 34 is connected to control device 30 and is used to seal recycle container 31. In response to signals on wire lead 34b, control device 30 seals recycle container 31. In an embodiment, wire lead 34b is coupled to controller 57. Vacuum tube 33 is attached to filter 32 which prevents the photoresist from entering vacuum 38. In an embodiment, vacuum 38 is house exhaust. Thus, when excess photoresist from process chamber 12 exits process chamber 12 and is stored in recycling bottle 31, control device 34 seals the recycle container 31 creating a pressurized seal over photoresist 31a. The photoresist 31a then may be subsequently used in further semiconductor wafer processing steps. Typically 97% of the photoresist is wasted in a process step. Thus, a substantial savings in manufacturing cost may be obtained by using photoresist 31a in recycling container 31 in subsequent photoresist spin-on steps.

Figure 4:
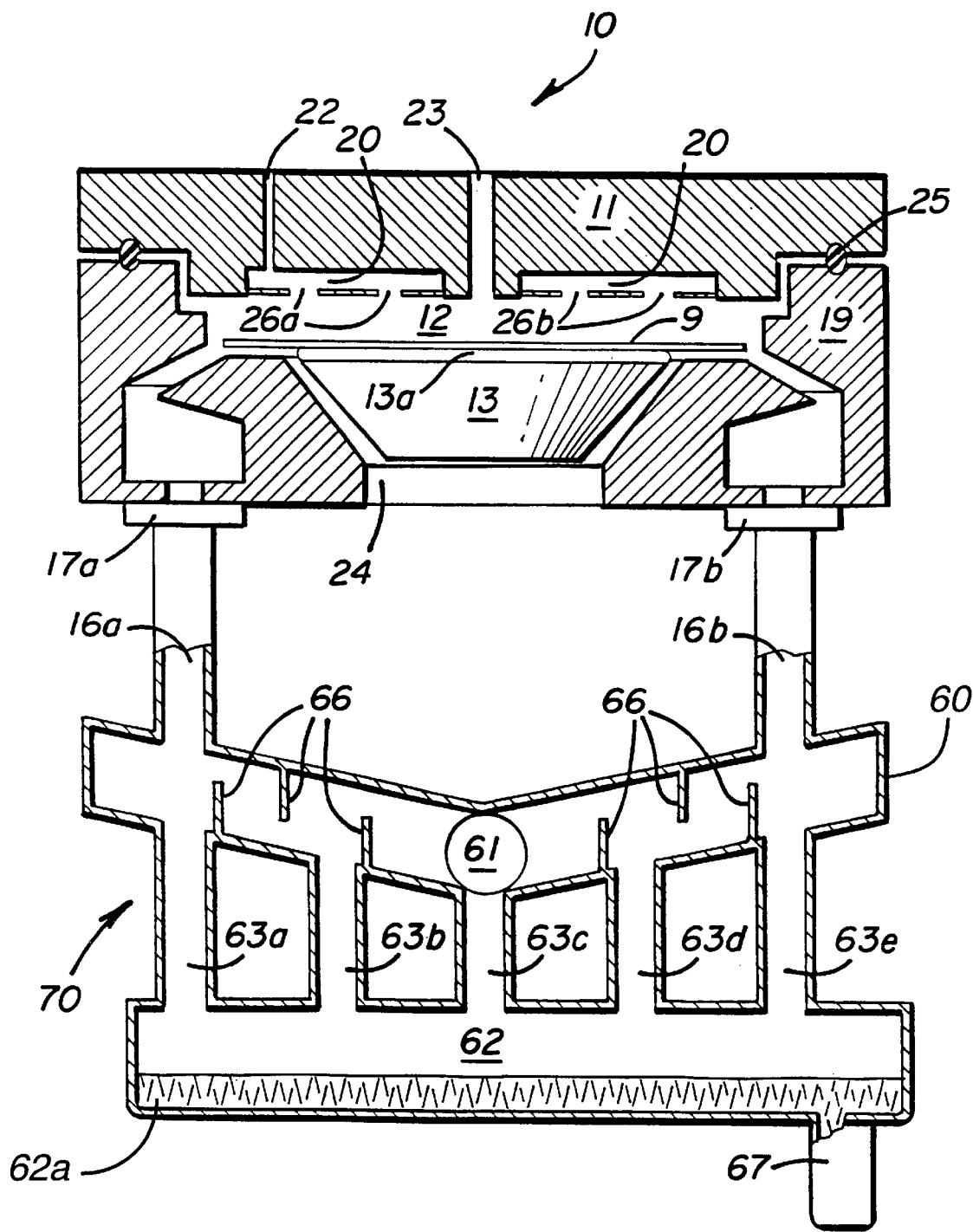
FIG. 4 illustrates a coater having a controllable pressurized process chamber and photoresist recycling apparatus according to the present invention.

FIG. 4 illustrates an additional recycling apparatus embodiment according to the present invention. As in FIG. 1, like reference numerals represent like structure. Only a portion of coater 10 is illustrated in FIG. 4 in order to clearly show the recycling apparatus 70. Recycling apparatus 70 includes a collection tube 60 coupled to exhaust tube 16a and 16b. Collection tube 60 contains a plurality of openings for inserting tubes 63a–e. In addition, an exhaust port 61 is used to connect vacuum tube 33 and filter 32 as illustrated in FIG. 1. An exhaust valve is also coupled to exhaust port 61 and container 67 in order to keep process chamber 12 at a predetermined pressure. Baffles 66 are positioned in order to direct excess photoresist from process chamber 12. Baffles 66 channel the excess photoresist into tubes 63a–e and ultimately into reservoir 62. Excess unused photoresist is represented by reference numeral 62a in reservoir 62. Reservoir 62 may also have a recycling container 67 attached for storing excess photoresist 62a.

Figure 5:
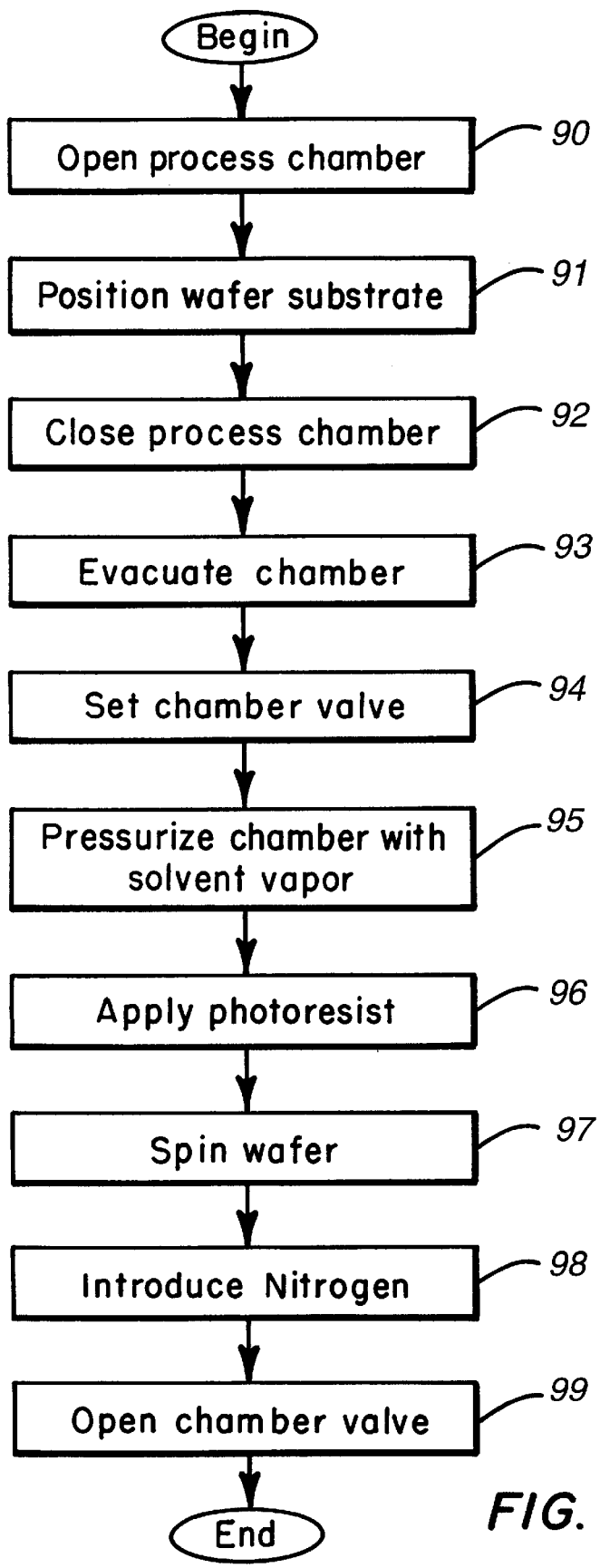
FIG. 5 illustrate a logic flow chart for processing a wafer in a coater having a controllable pressurized process chamber according to the present invention.

FIGS. 5a–b illustrate the process steps in developing a substrate 9 coated with photoresist using coater 10 according to the present invention. The process begins with opening the process chamber as illustrated in logic block 40. In particular, piston 42a is positioned downward moving lower section 19 and unsealing process chamber 12. A wafer substrate 9 is then positioned as illustrated by logic block 91. A wafer is positioned on wafer chuck 13a and secured by back pressure in a vacuum channel or an electrostatic charge. In logic block 92, the process chamber 12 is then closed and sealed by moving piston 42a upward, thereby sealing process chamber 12. Process chamber 12 is then evacuated, as illustrated in logic block 93. A chamber valve is set in control device 30 in response to signals on wire lead 30a as illustrated in logic block 94. The amount of back pressure from vacuum 38 is then controlled by the chamber valve setting and amount of pressure created by vacuum 38. Pressurized solvent vapor is then introduced in logic block 95. Specifically, a solvent vapor delivery system 50 is attached to opening 22 and pressure regulator 53 is set to the desired pressure. A solvent vapor is then created and injected into cavity 20 and ultimately through opening 26a–b to process chamber 12. The photoresist is then introduced into process chamber 12 through opening 23 as illustrated by logic block 96. The substrate 9 is then spun by rotating wafer chuck 13 with motor 15 in response to signals on wire leads 27 as illustrated in logic block 97. Nitrogen may be introduced into process chamber 12 as illustrated by logic block 98. Excess photoresist and solvent vapor is then exhausted through exhaust tube 16a. Finally, the chamber valve is opened as illustrated in logic block 99.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. For example, it should be understood, that one of ordinary skill in the art could use a variety of process steps in creating a photoresist layer on a wafer using a coater. The above process steps have been provided for illustration and could be modified according to the particular application intended. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A method of spin coating a semiconductor substrate with a desired liquid material, comprising the steps of:
    providing a process chamber having an enclosed interior;
    controlling a pressure within the interior of the chamber;
    securing the substrate at a position within the interior of the chamber;
    spinning the substrate;
    dispensing said desired liquid material onto the substrate;
    supplying a solvent into a showerhead cavity; and
    dispensing said solvent from the showerhead cavity into the interior of the chamber through a plurality of showerhead outlet apertures.

2. A method according to claim 1, further comprising the step of:
    positioning the showerhead outlet apertures so as to be distributed over an area that is parallel to and adjacent to the substrate and is approximately equal to the area of the substrate.

3. A method according to claim 1, wherein the pressure controlling step comprises reducing said pressure substantially below atmospheric pressure.

4. A coater for spin coating a wafer substrate with a desired liquid material, comprising:
    (a) a wafer chuck having a wafer chuck surface for positioning the wafer substrate;
    (b) a spin motor coupled to the wafer chuck so as to rotate the wafer chuck;
    (c) a process chamber housing enclosing the wafer chuck surface;
    (d) a control device, coupled to the process chamber housing, for controlling a pressure in the process chamber housing;
    (e) a chamber inlet aperture for admitting said desired liquid material into the interior of the process chamber housing, wherein the inlet aperture is positioned adjacent the substrate so that the admitted liquid material impinges on the substrate; and
    (f) a showerhead enclosing a cavity for containing solvent vapor, wherein the showerhead includes a plurality of cavity openings for supplying the solvent vapor from the cavity into the process chamber.

5. A coating apparatus for spin coating a semiconductor substrate with a desired liquid material, comprising:
    a process chamber having an enclosed interior;
    a pressure control device for controlling a pressure within the interior of the chamber;
    a chuck for securing the substrate at a position within the interior of the chamber;
    a motor coupled to the chuck so as to spin the substrate;
    a chamber inlet aperture for admitting said desired liquid material into the interior of the chamber, wherein the inlet aperture is positioned adjacent said substrate position so that the admitted liquid material impinges on the substrate; and
    a showerhead enclosing a cavity, wherein:
        the cavity is connected to receive a solvent, and
        the cavity includes a plurality of showerhead outlet apertures, in contact with the interior of the chamber, through which the showerhead dispenses the solvent into the interior of the chamber.

6. A coating apparatus according to claim 5, wherein the showerhead is mounted so that the showerhead outlet apertures are adjacent the position at which the chuck secures the substrate.

7. A coating apparatus according to claim 6, wherein:
    the substrate is substantially planar and occupies an area;
    the showerhead outlet apertures are positioned substantially in a plane parallel to and adjacent to the substrate; and
    the positions of the showerhead outlet apertures are spaced apart so as to be distributed over an area in said plane approximately equal to the area of the substrate.

8. A coating apparatus according to claim 5, wherein the showerhead further comprises:
    a housing wall that encloses the showerhead cavity; and
    an inlet aperture in the housing wall, the inlet aperture being connected to receive said solvent;
    wherein said outlet apertures are located in the housing wall; and
    wherein the solvent received through the showerhead inlet aperture flows into the showerhead cavity, through the outlet apertures, and then into the interior of the chamber.

9. A coating apparatus according to claim 8, further comprising:
    a vaporizer for vaporizing said solvent to produce solvent vapor, the vaporizer being connected to supply the solvent vapor to the showerhead inlet aperture.

10. A coating apparatus according to claim 5, wherein the pressure control device reduces the pressure within the interior of the chamber substantially below atmospheric pressure.

* * * * *